US006337591B1

(12) United States Patent
Maggiolino

(10) Patent No.: US 6,337,591 B1
(45) Date of Patent: Jan. 8, 2002

(54) CIRCUITRY FOR A HIGH VOLTAGE LINEAR CURRENT SENSE IC

(75) Inventor: Joseph Maggiolino, Rancho Palos Verdes, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/553,756

(22) Filed: Apr. 21, 2000

Related U.S. Application Data

(60) Provisional application No. 60/166,727, filed on Nov. 22, 1999, provisional application No. 60/166,728, filed on Nov. 22, 1999, and provisional application No. 60/130,648, filed on Apr. 23, 1999.

(51) Int. Cl.[7] .......................... H03K 3/017; H03K 5/04; H03K 7/08

(52) U.S. Cl. ....................................... 327/172; 327/175

(58) Field of Search ................................. 327/172, 175

(56) References Cited

U.S. PATENT DOCUMENTS 5,442,317 A 8/1995 Stengel ........................ 330/10
5,574,344 A * 11/1996 Matsuoka et al. .......... 318/293
5,917,369 A * 6/1999 Nguyen ....................... 330/10
5,949,282 A 9/1999 Nguyen et al. ............... 330/10
6,072,361 A 6/2000 Myers et al. ................. 330/10
6,127,885 A * 10/2000 Colangelo .................... 330/10
6,215,435 B1 * 4/2001 Parry et al. ................. 341/157

* cited by examiner

*Primary Examiner*—Terry D. Cunningham
*Assistant Examiner*—Quaai Tra
(74) *Attorney, Agent, or Firm*—Ostrolenk, Faber, Gerb & Soffen, LLP

(57) ABSTRACT

A high voltage linear current sense integrated circuit includes a differential amplifier circuit that can amplify a differential signal in the hundreds of millivolts near the power supply. In addition, a constant current using opposing minus temperature coefficient MOSFETs is provided. Accordingly, an op-amp circuit is provided with an input offset voltage which is constant and insensitive to temperature changes. A circuit for generating a current reference on the high side of the current sense IC also is provided.

4 Claims, 11 Drawing Sheets

CIRCUITRY FOR A HIGH VOLTAGE LINEAR CURRENT SENSE IC

This application claims the benefit of U.S. Provisional Application Ser. No. 60/130,648 filed Apr. 23, 1999, U.S. Provisional Application Ser. No. 60/166,727 filed Nov. 22, 1999, and U.S. Provisional Application Ser. No. 60/166,728 filed Nov. 22, 1999.

BACKGROUND OF THE INVENTION

1. Field of the Invention

The present invention relates to circuitry for a high voltage integrated circuit (IC), and, more specifically, to a differential amplifier circuit that can amplify a differential signal in the hundreds of millivolts near the high voltage power supply, minimize inherent temperature offset drift, and generate a high side current reference in a current sense IC.

2. Description of the Related Art

The circuitry of a high voltage current sense IC, such as the IR2171 current sense IC sold by International Rectifier Corporation of El Segundo, Calif. are disclosed in U.S. patent application Ser. No. 09/266,822 filed Mar. 12, 1999, the entire disclosure of which is incorporated herein by reference.

The IR2171 provides a circuit for transferring static or time variable analog information without electrical isolation from a first (source) reference potential to a second (destination) reference potential.

More specifically, the IR2171 circuit recovers an input signal at a first potential which is offset by a common mode displacement from a second potential. The circuit in its most basic form includes: (1) circuitry for converting the input signal at the first potential to a pulse width modulated signal; and (2) circuitry for level shifting the pulse width modulated signal from the first potential to the second potential. The IR2171 advantageously can be used in a motor controller for transferring information relating to current flow through a high side resistor from a high voltage potential to a lower level potential for conditioning and processing the information.

Desirable features for a high voltage current sense IC, such as the IR2171, include a differential amplifier that can amplify a differential signal in the hundreds of millivolts near the power supply, minimize inherent temperature offset drift, and generate a high side current reference.

FIG. 1 shows a typical prior art differential amplifier circuit 2. Circuit 2 includes a differential amplifier 4 biased by four matching resistors 6, 8, 10, and 12. The advantage of the prior art differential amplifier circuit, such as the circuit shown in FIG. 1, is that Vin can be amplified with a CMIV (common mode input voltage) from $V_{SS}$=−1V to close to $V_{DD}$.

The disadvantages of the circuit of FIG. 1 include the following: (1) four matching resistors 6, 8, 10, and 12 are required; (2) the four resistors occupy valuable space on the die; (3) the CMRR (common mode rejection ratio) depends on how closely the resistors are matched, which is typically not better than 1% in an IC implementation; (4) the offset also depends on how closely the resistors are matched; and (5) $V_{ref}$, which needs to supply current in 10 and 12, should have a low impedance output; in practice, $V_{ref}$ is implemented as a voltage reference and follower op-amp 14, as shown in FIG. 2.

FIG. 3 shows another prior art differential amplifier circuit 16. Circuit 16 includes differential amplifier 18, resistors 20 and 22, and provided with a Vref 24. The advantages of circuit 16 of FIG. 3 are as follows: (1) only two resistors 20 and 22 need be matched, which is much easier and results in a CMMR of better than 0.5%; (2) the CMRR is improved with respect to circuit 2 of FIG. 1, and the offset is better, both due to the reduced number of resistors required (resulting in improved resistor matching); and (3) $V_{ref}$ is a high impedance load, and therefore be a simple resistor divider; since there is no need for the buffer of FIG. 2, the circuit occupies a small area. The disadvantage of circuit 16 of FIG. 3 is that it can only have a CMIV of $V_{SS}$, since $V_{in}$ is referenced to $V_{SS}$.

A further shortcoming of the prior art is that conventional op amps have an input offset voltage which is temperature sensitive. It would be desirable to provide an op amp circuit in which the input offset voltage is constant and independent of changes in temperature.

High voltage current sense ICs require a high side current reference. Referring to FIG. 4, this is typically accomplished by providing an NPN transistor 22 which has its collector tied to a $V_B$ supply. As described more fully below, by regulating the voltage of emitter resistor 24 of the NPN transistor and repositioning resistor 24, a $\Delta V_{be}/R$ current reference can be implemented on the high-side. Very good tolerance (±10%) and power supply rejection ratio has been implemented using this approach.

SUMMARY OF THE INVENTION

The present invention advantageously provides a differential amplifier circuit for a current sense IC which overcomes the disadvantages of the prior art circuits discussed above and can amplify a differential signal in the hundreds of millivolts near the power supply. In addition, the circuit of the present invention generates a constant current using opposing minus temperature coefficient MOSFETs. Accordingly, the invention provides an op-amp circuit with an input offset voltage which is constant and insensitive to temperature changes. The invention also advantageously provides a circuit for generating a current reference on the high side of the current sense IC.

Other features and advantages of the present invention will become apparent from the following description of the invention which refers to the accompanying drawings.

DETAILED DESCRIPTION OF THE PREFERRED EMBODIMENTS

Figure 5A:
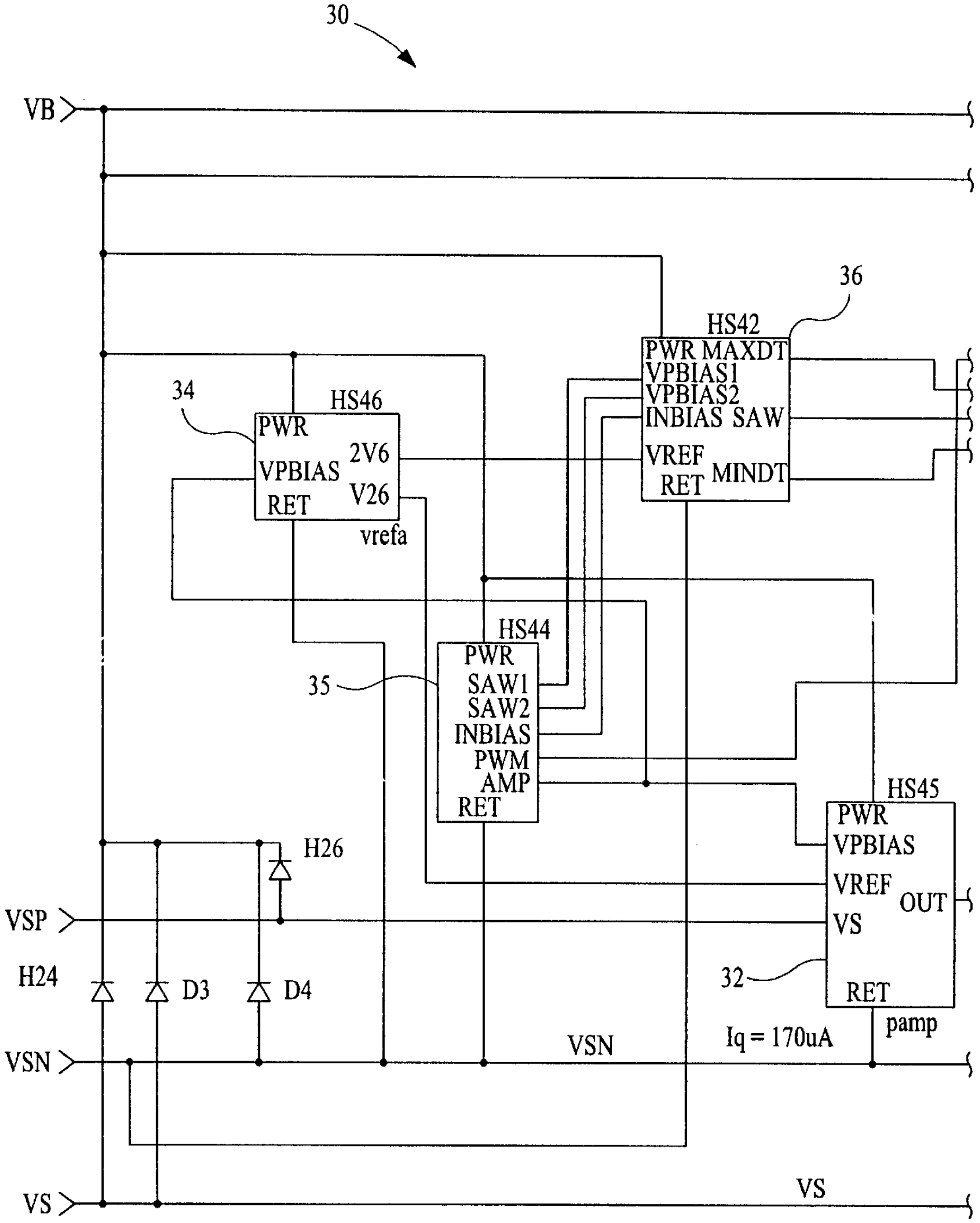
FIG. 5 is a block diagram of a current sense integrated circuit according to the present invention.
Figure 5:
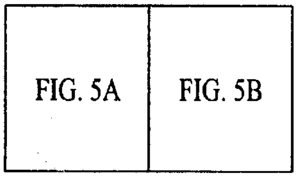
Figure 5B:
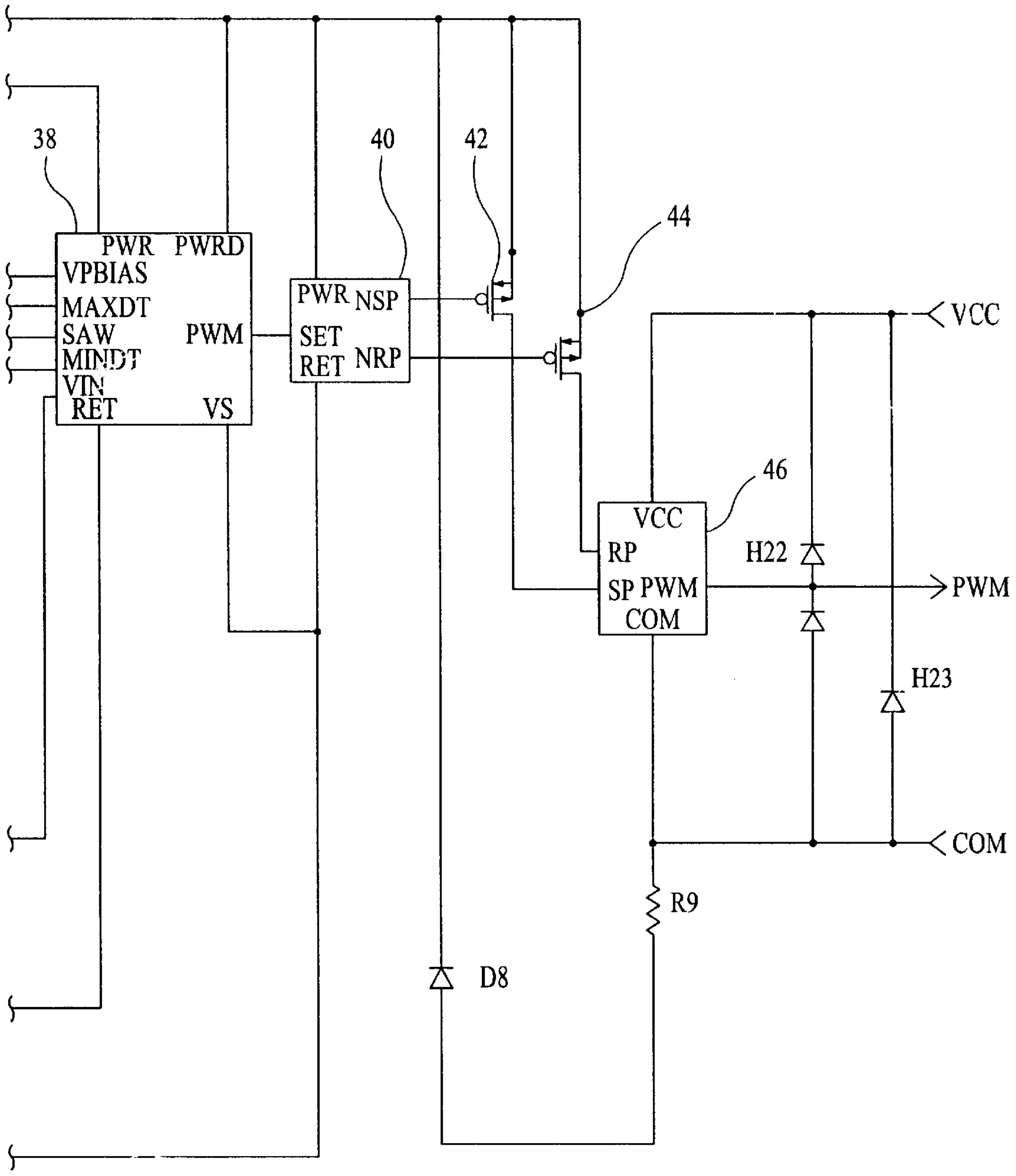

Referring to FIG. 5, a block diagram of the circuitry of a high voltage current sense IC 30 according to a preferred embodiment of the present invention is shown. The signal of interest VSP is first input to a differential amplifier (Pamp) 32 for buffering and amplification as necessary. Other offset adjustments may be performed as required. Reference voltage generating circuitry 34 provides the input VREF to PAMP 32, as well as to other sections of the IC. Current reference 35 is also provided.

The amplified signal from Pamp 32 is converted from analog to pulse form using pulse-width modulation encoding. In a preferred embodiment of the invention, a sawtooth generator 36 outputs a high frequency (e.g., 40 kHz) waveform (the sawtooth generator may, if desired, be replaced with a triangle wave generator). The output of pulse width modulator PWM 38 is a pulse width modulated waveform, in which the width of the pulses represents the voltage VSP.

PWM 38 output is fed to pulse generator 40 which produces a rising edge triggered pulse and a failing edge triggered pulse. These pulses are transposed to a lower potential through MOSFETs 42 and 44, and low side conversion circuit 46. Recovery of the digital PWM data is performed at the lower reference potential.

PWM Circuit

Figure 6:
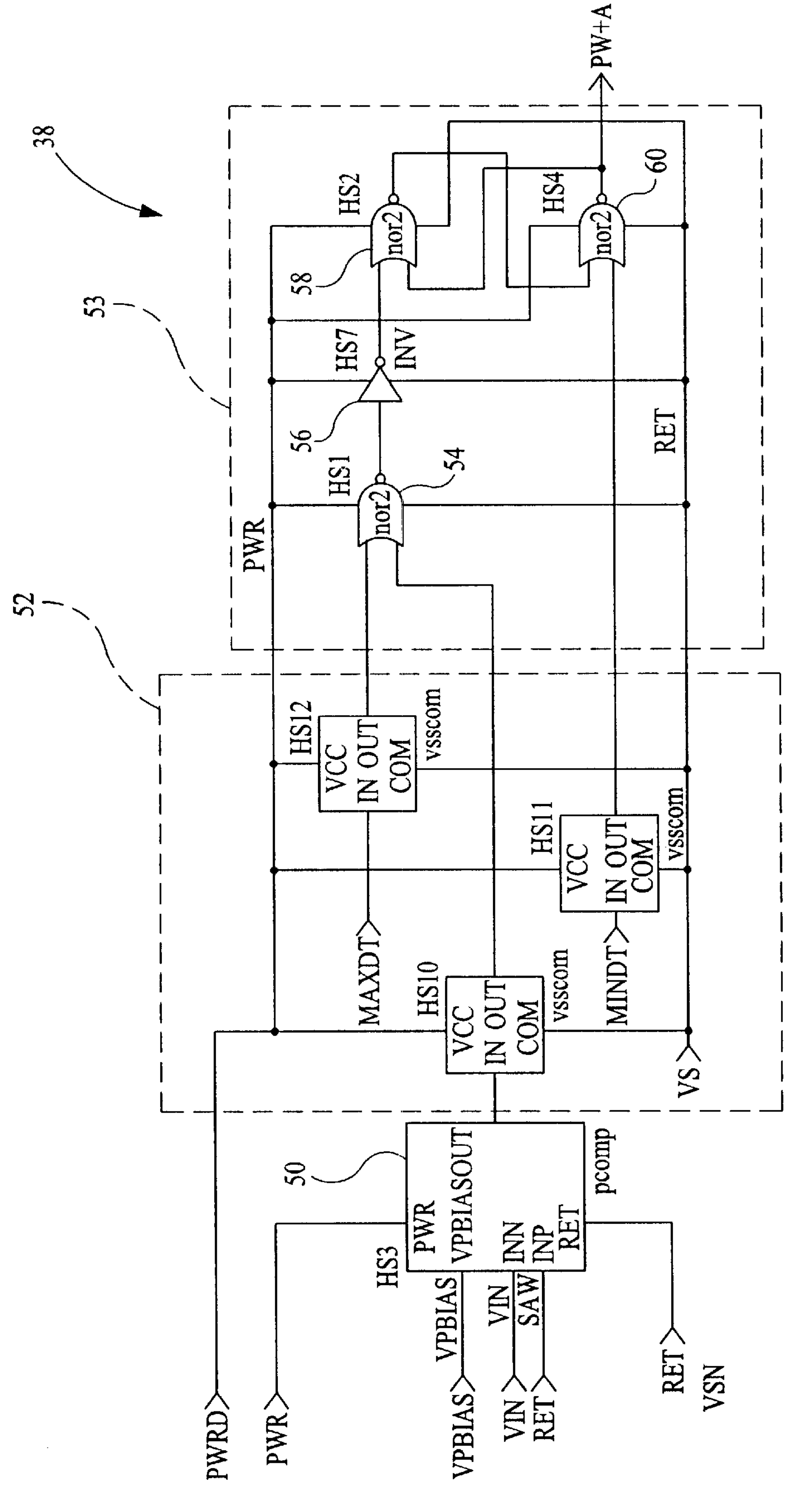
FIG. 6 is a functional block diagram of a pulse width modulator circuit according to the present invention.

FIG. 6 shows a more detailed block diagram of PWM circuit 38. PWM circuit 38 includes pcomp circuitry 50, level shift circuitry contained in block 52, and digital circuitry 53 including NOR gate 54, inverter 56, and NOR gates 58 and 60.

PAMP

Figure 3:
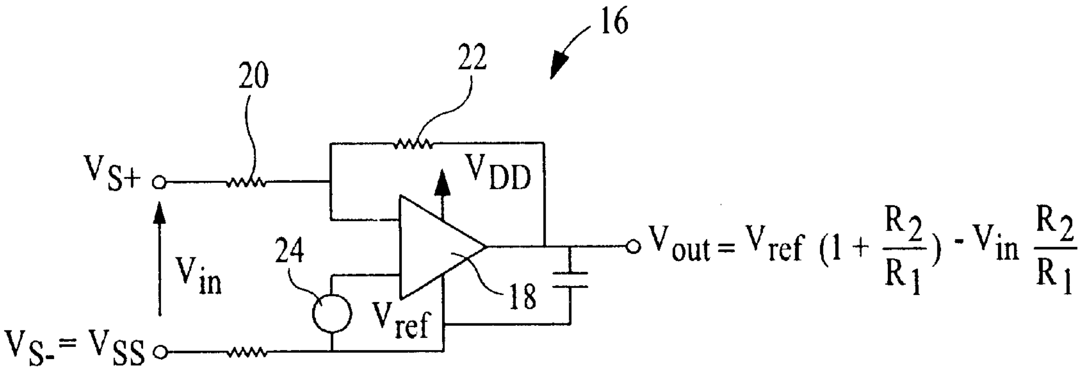
FIG. 3 is a diagram of another differential amplifier circuit according to the prior art.
Figure 7:
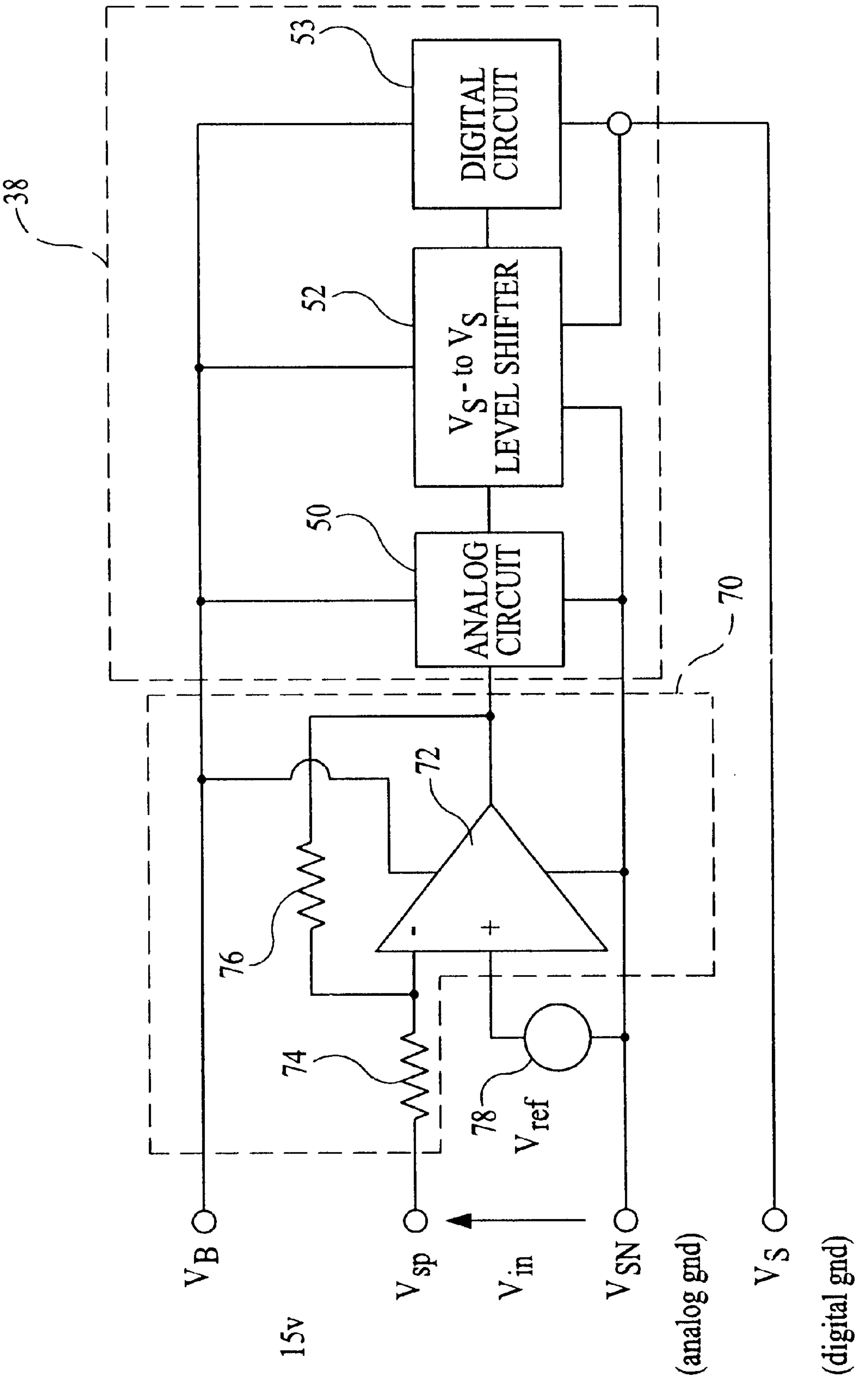
FIG. 7 is a diagram of a differential amplifier circuit according to the present invention.

Referring to FIG. 7, a differential amplifier circuit 70 according to the present invention is shown being implemented in the IR-2171 current sense IC. Differential amplifier circuit 70 includes differential amplifier 72 and matched resistors 74 and 76. VREF 78 is provided by reference circuitry 34 (FIG. 5). Differential amplifier circuit 70 has all of the advantages of the prior art circuit of FIG. 3, but in addition, assuming VDD=15V, the CMIV has an increased range from VSS=−5V (increased compared to the circuits of FIGS. 1 and 3) to VSS=+5V.

Figure 1:
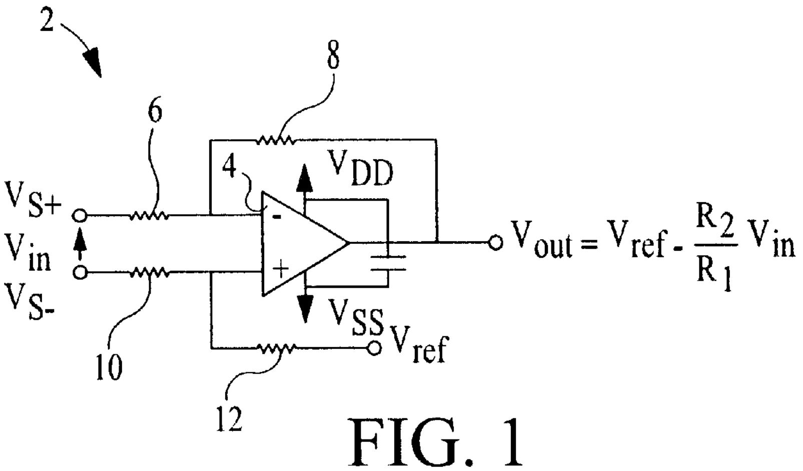
FIG. 1 is a diagram of a differential amplifier circuit according to the prior art.
Figure 2:
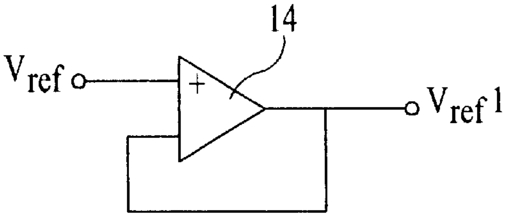
FIG. 2 is a diagram of a voltage reference and follower op-amp circuit according to the prior art.
Figure 8:
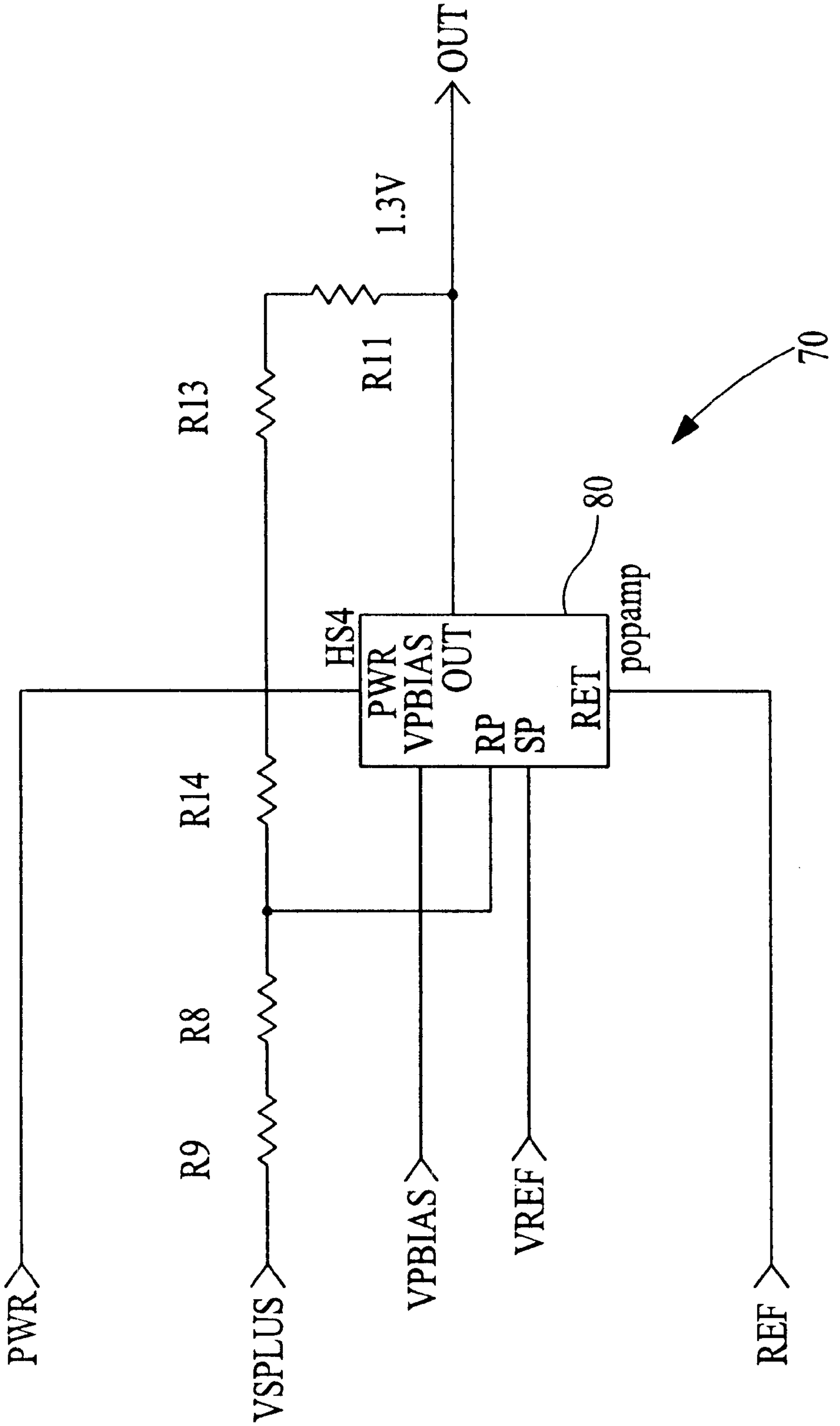
FIG. 8 is a diagram of an integrated circuit implementation of the differential amplifier circuit of FIG. 7.

In the circuit 70 of FIG. 7, the CMIV cannot go to VDD, as compared to the circuit of FIG. 1; however, this feature is unnecessary in high voltage current sense ICs such as the IR2171. In addition, at least one more decoupling capacitor (not shown) is required from VSN to VB, as VSN is now the supply return for the analog section of the IC. An IC implementation of the circuit 70 of FIG. 7 is shown in FIG. 8, in which differential amplifier 72 has been replaced by a PMOS operational amplifier 80, as described more fully below.

Circuit to Minimize Temperature Offset Drift—POPAMP

Figure 9:
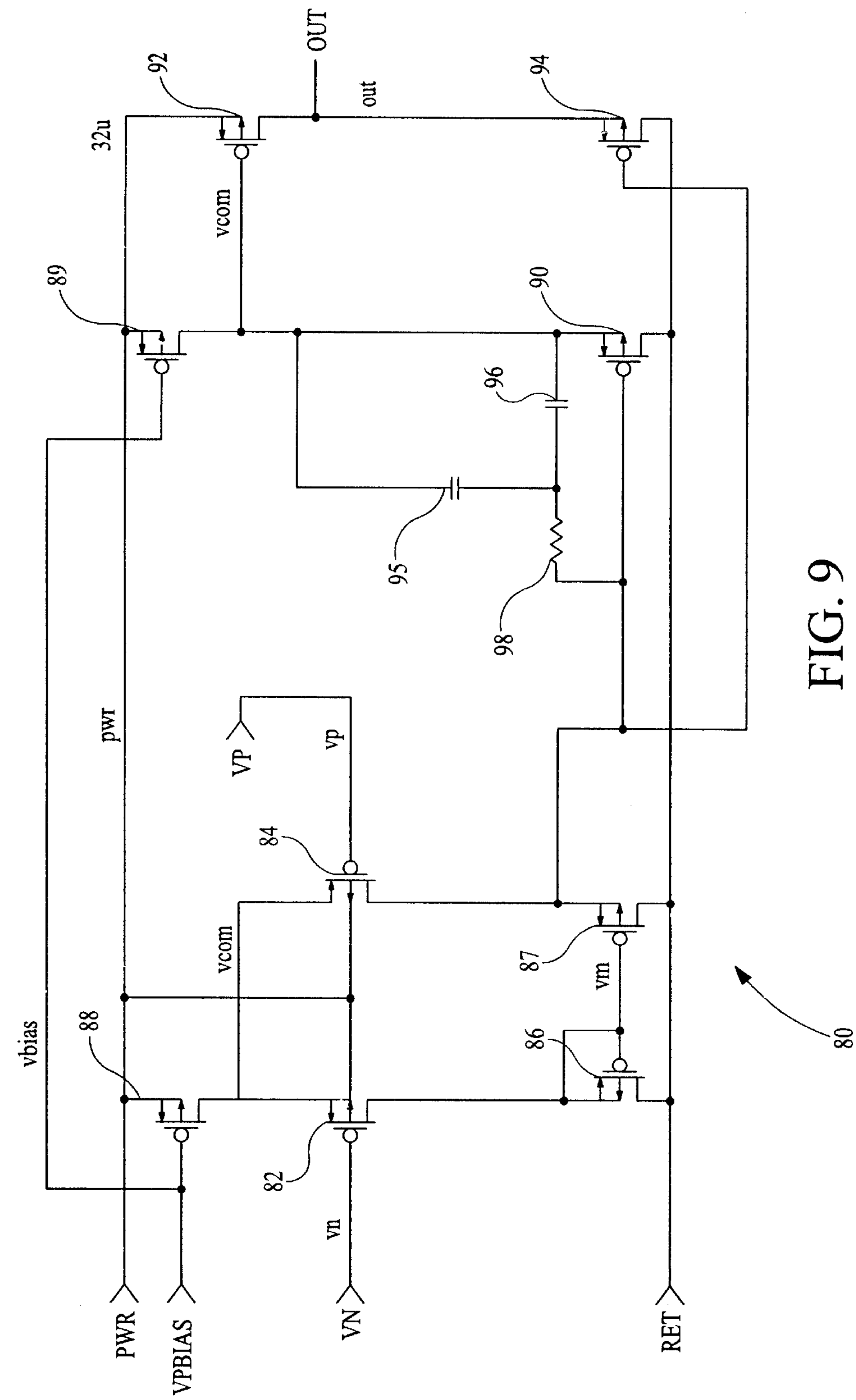
FIG. 9 is a diagram of a PMOS op amp circuit with minimized temperature drift according to the present invention.

FIG. 9 is a more detailed circuit diagram of PMOS op amp 80 of the present invention, which has an input voltage which is temperature insensitive. According to a preferred embodiment, op amp 80 forms part of PAMP 70 shown in FIG. 7 discussed above.

Referring to FIG. 9, Popamp circuit 80 is provided with mirrored or opposing MOSFETs 82, 84 such that the offset voltage of the circuit is the difference between the gate-to-source voltage (Vgs) of MOSFETs 82 and 84. Matching MOSFET devices 86 and 87 are provided to ensure equal current capabilities and biasing of MOSFETs 82 and 84. W/L for MOSFET 87 is set for saturation operation. MOSFETs 88 and 89 are matched to ensure the same currents through their branches. MOSFET 89 biases inverting stage 90 with constant temperature independent currente. MOSFETs 92 and 94 provided additional gain. Alternatively, using bipolar technology, devices 92 and 94 could be eliminated. In addition, the W/L sizing of MOSFETs 92 and 94 is selected to provide a small output impedance. Capacitors 95 and 96, and the resistor 98 move right half plane zero to infinity, and maintain good stability of the POPAMP circuit 80.

If the gate-to-source voltages of MOSFETs 82 and 84 are constant over temperature, the offset voltage should be constant over temperature. Thus, the circuit forces a constant current using the opposing minus temperature coefficient MOSFETs.

Figure 10:
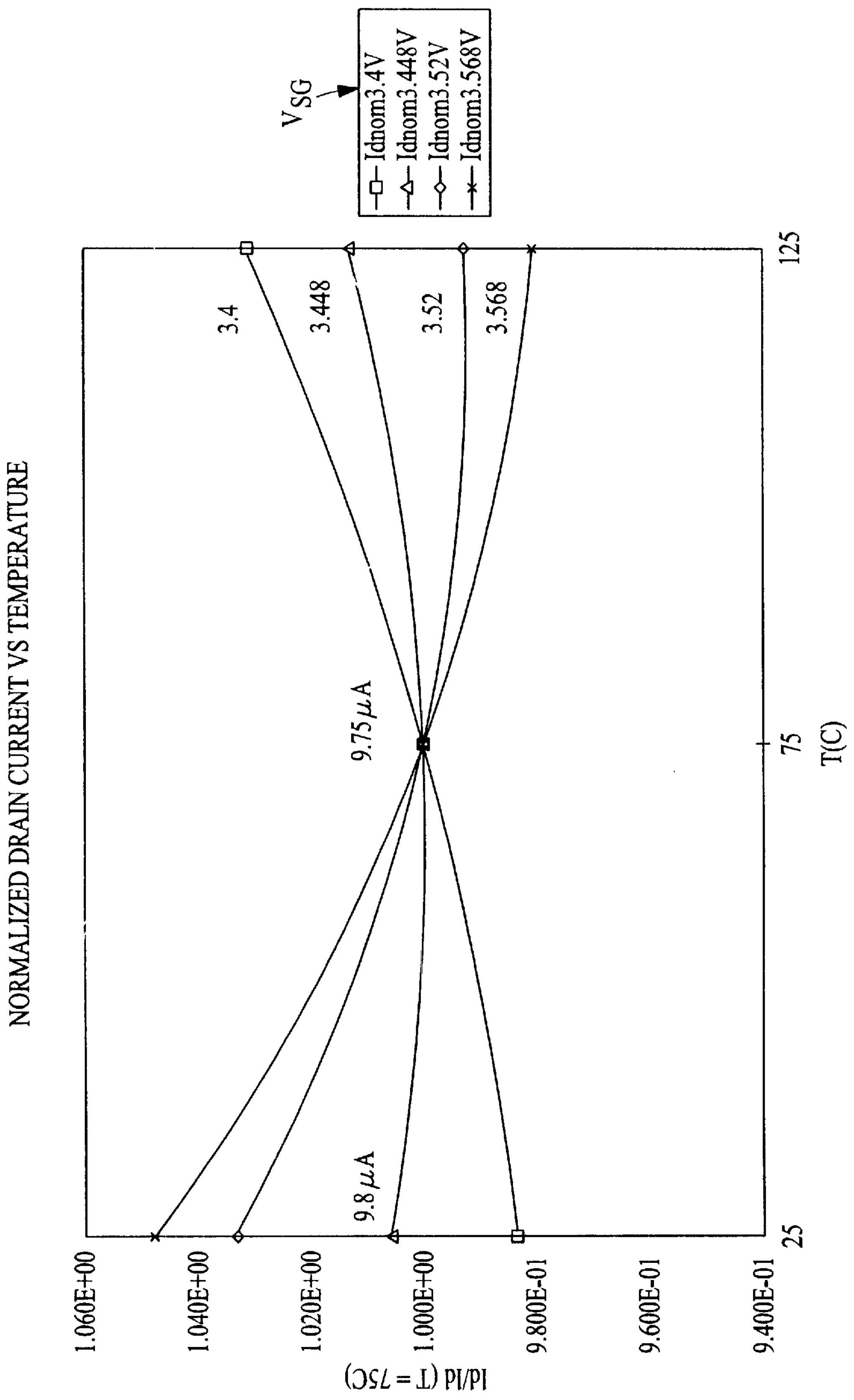
FIG. 10 is a graph illustrating drift current in the circuit of FIG. 9.

The relationship is based on the following formula for ID (drift current) and is shown in the graph of FIG. 10:

$$I_D=k(V_{GS}V_T)^2$$

$$k=\frac{\mu C_{ox}}{2}$$

where $C_{OX}$ is the oxide capacitance and both $V_T$ and $\mu$ are values which decrease as the temperature increases.

Current Reference in High Side Well of Chip Driver

Figure 4:
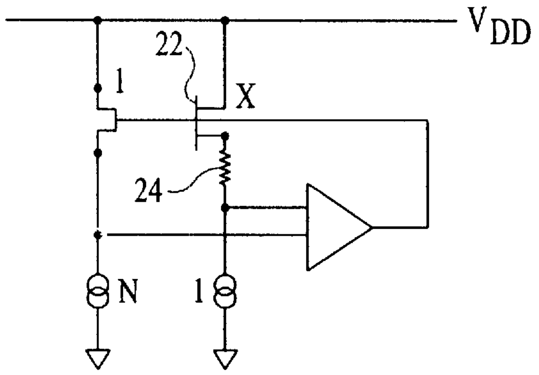
FIG. 4 is a diagram of a typical prior art high side current reference circuit for a high voltage current sense integrated circuit.

A high side current reference is provided according to the present invention by regulating the emitter voltage of the NPN transistor and repositioning the resistor as discussed above in connection with the prior art circuit of FIG. 4, so that the current reference resides in the high side well of the high voltage IC.

The following equations are applicable to the prior art circuit shown in FIG. 4:

$$V_R=\Delta Vbe=\frac{n\cdot k\cdot T}{9}\ln(X\times N)$$

$$I_{ref}=\frac{V_R}{R}$$

Figure 11:
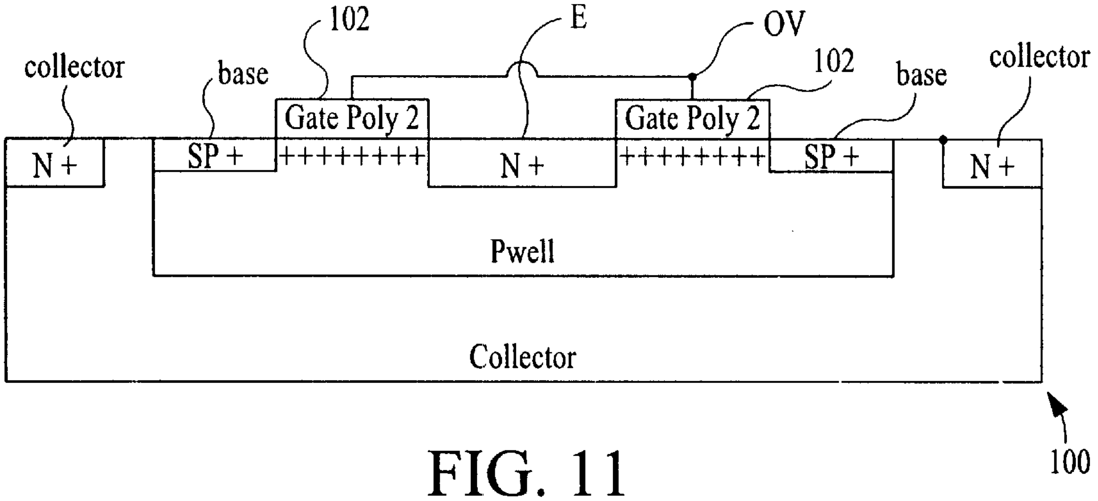
FIG. 11 is an elevation of an NPN transistor layout according to the present invention.
Figure 12:
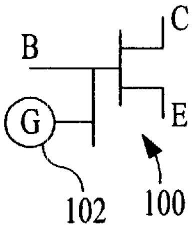
FIG. 12 is a schematic illustration of an NPN transistor according to the present invention.

To make $\Delta V_{be}/R$ close to ideal, n in the above equation should be 1. A layout 100 for an NPN transistor, shown in FIGS. 11 and 12, makes n as close as possible to 1. In accordance with the present invention, a gate 102 is added to the NPN transistor to enhance the P well surface.

Figure 13A:
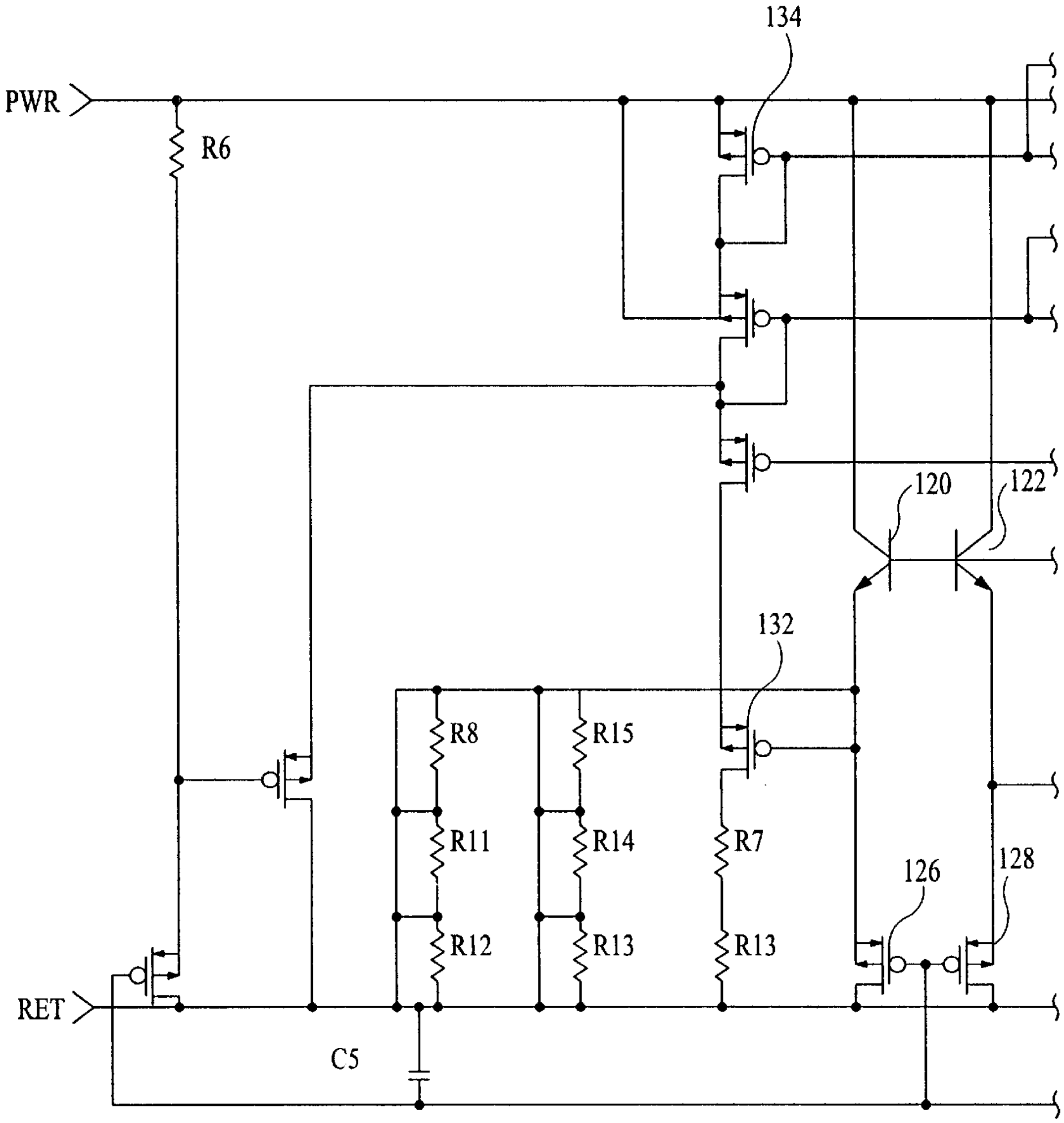
FIG. 13 is a circuit diagram of a high side current reference according to the present invention.
Figure 13:
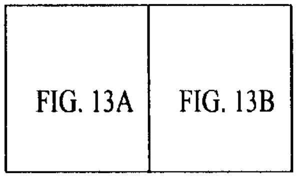
Figure 13B:
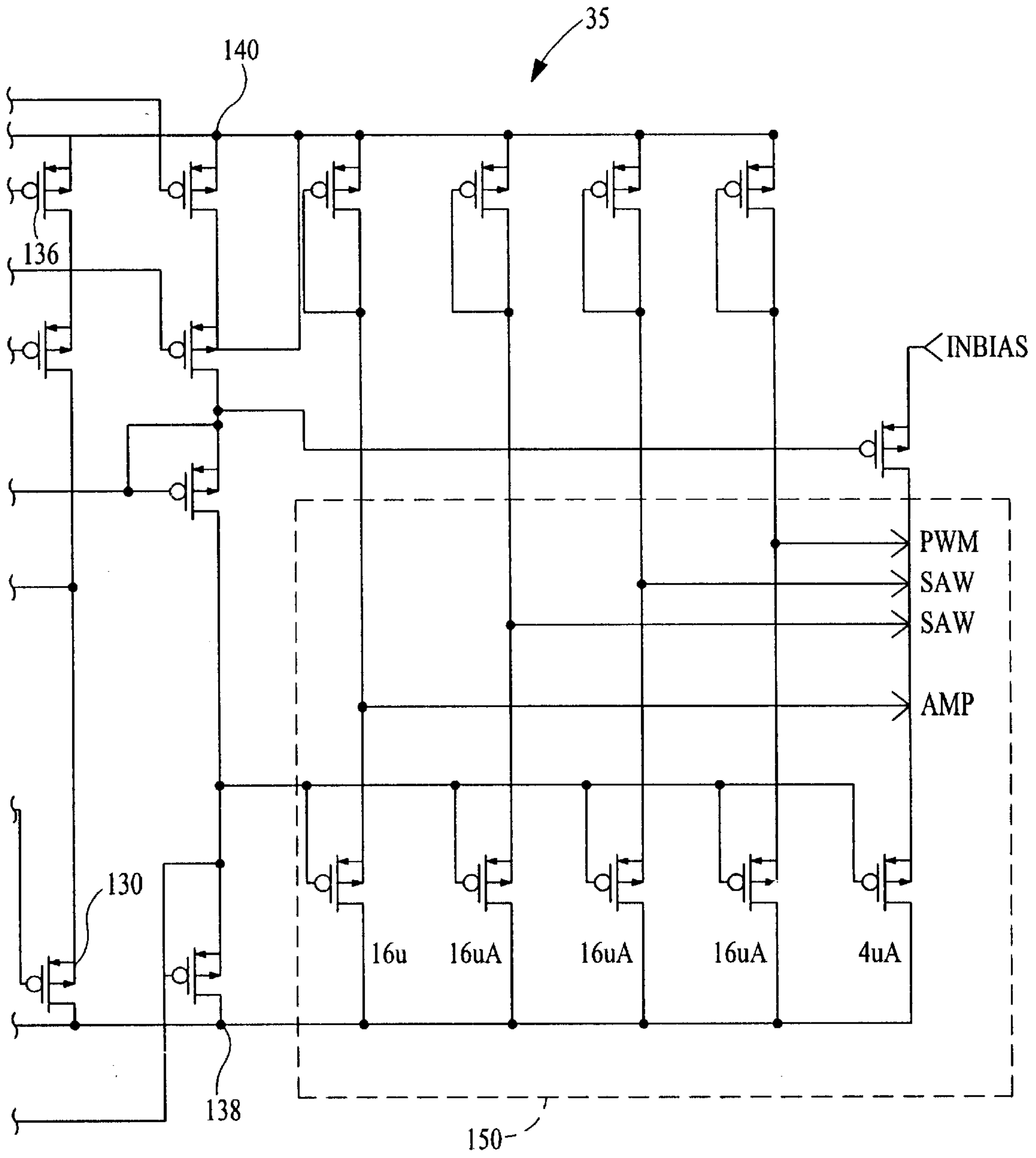

The implementation of the present invention in the prior art circuit of FIG. 4 requires an amplifier that occupies a lot of area. Referring to FIG. 13, the implementation of the present invention in a high voltage current sense IC is identified as current reference 35 (FIG. 5).

Matching transistors 120 and 122 form the $\Delta V_{be}/R$. The area ratio is 9:1 and the current ratio, determined by MOSFETs 126 and 128, is 1:5 so that $$\Delta Vbe = V_t \ln 45,\ V_t = \frac{kt}{9},\ 45 = 9xs$$

$$\Delta Vbe \sim 100m\gamma$$

$$I_{ref} = \frac{\Delta Vbe}{R} = \frac{0.1}{R}A = \frac{100}{R(k\pi)}\mu A$$

MOSFETs 130,132,133, and 136 form the amplifier. The output of the amplifier $V_{out}$ is the drains of MOSFETs 130 and 136. The configuration is such that $\Delta V_{be}/R$ is mirrored from the source of MOSFET 132 to analog ground.

Other devices in circuit 35 are provided for startup, stability and to increase power supply rejection ratio. Preferably, in order to approach an ideal result, certain groups of devices are matched: Transistors 120 and 122; MOSFETs 130 and 132; MOSFETs 126, 128, and 138; MOSFETs 134, 136, and 140. Accordingly, $\Delta V_{be}$ depends only on the above matching and temperature.

$$\Delta V_{be=\frac{kt}{9}\ln}\quad \text{(area ratio} \times \text{current ratio).}$$

$I_{ref}$ will then only depend on absolute value of R, as follows:

$$Iref = \frac{\Delta Vbe(T)}{R(T)}$$

If R(T) tracks $\Delta V_{be}$ (T) with respect to temperature, then $I_{ref}$ will be independent of temperature, and will depend only on absolute value of R. Using $P_{body}$ and SP+ to get the correct temperature on R, R can be made to ±10% accuracy, so $I_{ref}$ will have ±10% accuracy (assuming matching and n factor ideal).

A plurality of current reference signals can be provided to various portions of the IC by way of block 150.

Although the present invention has been described in relation to particular embodiments thereof, many other variations and modifications and other uses will become apparent to those skilled in the art. Therefore, the present invention is limited not by the specific disclosure herein, but only by the appended claims.

What is claimed is:

1. A current sense integrated circuit, comprising:

an amplifier circuit for receiving and amplifying a differential analog input signal at a first voltage level containing current sense information, wherein the amplifier circuit includes a circuit to minimize inherent temperature offset drift;

a pulse width modulator circuit for converting the differential analog input signal to a pulse width modulated signal at the first voltage level;

a level shift circuit for converting the pulse width modulated signal from the first voltage level to a second voltage level; and a recovery circuit for reconstructing the analog input signal at the second voltage level.

2. The current sense integrated circuit of claim 1, wherein the circuit to minimize inherent temperature offset drift comprises a pair of mirrored MOSFETs, such that the circuit has an offset voltage which is equal to the difference between the gate-to-source voltage of the MOSFETs and remains constant over temperature variations.

3. The current sense integrated circuit of claim 1, wherein the level shift circuit comprises a pulse generator circuit for producing rising edge triggered pulses and falling edge triggered pulses from the pulse width modulated signal and a pair of MOSFETs for receiving the rising edge triggered pulses and the falling edge triggered pulses and transposing those pulses from the first voltage level to the second voltage level.

4. The current sense integrated circuit of claim 1, further comprising a high side current reference circuit.

* * * * *